(12) United States Patent
Noh et al.

(10) Patent No.: US 7,666,570 B2
(45) Date of Patent: Feb. 23, 2010

(54) LASER INDUCED THERMAL IMAGING METHOD AND FABRICATING METHOD OF ORGANIC LIGHT-EMITTING DIODE USING THE SAME

(75) Inventors: Sok Won Noh, Seoul (KR); Nam Choul Yang, Yongin-si (KR); Jae Ho Lee, Yongin-si (KR); Myung Won Song, Yongin-si (KR); Noh Min Kwak, Yongin-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 418 days.

(21) Appl. No.: 11/508,162

(22) Filed: Aug. 23, 2006

(65) Prior Publication Data
US 2007/0111117 A1    May 17, 2007

(30) Foreign Application Priority Data
Nov. 16, 2005    (KR) ...................... 10-2005-0109824

(51) Int. Cl.
*G03F 7/00* (2006.01)
*G03C 8/00* (2006.01)
(52) U.S. Cl. ................. 430/270.1; 430/273.1; 430/200; 430/199
(58) Field of Classification Search .............. 430/270.1, 430/273.1, 200, 199
See application file for complete search history.

(56) References Cited

U.S. PATENT DOCUMENTS

| | | | |
|---|---|---|---|
| 4,377,339 A | 3/1983 | Coppock | |
| 6,815,141 B2 | 11/2004 | Fujita et al. | |
| 6,887,650 B2 | 5/2005 | Shimoda et al. | |
| 6,911,667 B2 * | 6/2005 | Pichler et al. ................. | 257/40 |
| 7,396,631 B2 * | 7/2008 | Wright et al. ............... | 430/200 |
| 2003/0228417 A1 | 12/2003 | Nishikawa et al. | |
| 2007/0006807 A1 * | 1/2007 | Manz .......................... | 118/720 |

FOREIGN PATENT DOCUMENTS

CN    1450197 A    10/2003

(Continued)

OTHER PUBLICATIONS

Machine translation of JP 2004-296224.*

(Continued)

*Primary Examiner*—Amanda C. Walke
(74) *Attorney, Agent, or Firm*—Stein McEwen, LLP

(57) ABSTRACT

A laser induced thermal imaging method capable of effectively laminating a donor film and an acceptor substrate using a magnetic force; and a fabricating method of an organic light-emitting diode using the same. The laser induced thermal imaging method includes arranging an acceptor substrate, in which a first magnet is formed in one surface thereof, on a substrate stage in a processing chamber; arranging on the acceptor substrate a donor film including a second magnet; laminating the donor film and the acceptor substrate using a magnetic force acting between the first and second magnets; and transferring at least one region of an imaging layer onto the acceptor substrate by scanning a laser on the donor film. The laser induced thermal imaging method improved adhesion between the donor film and the acceptor substrate improves a life span, a yield and a reliability of the organic light-emitting diode.

19 Claims, 14 Drawing Sheets

FOREIGN PATENT DOCUMENTS

| | | | |
|---|---|---|---|
| EP | 749847 A1 * | 12/1996 | |
| JP | 5-138959 | 6/1993 | |
| JP | 8-123000 | 5/1996 | |
| JP | 2002-156664 | 5/2002 | |
| JP | 2003-076297 | 3/2003 | |
| JP | 2003-213410 | 7/2003 | |
| JP | 2004-079540 | 3/2004 | |
| JP | 2004-296224 | 10/2004 | |
| JP | 2004-355949 | 12/2004 | |
| JP | 2005-048250 | 2/2005 | |
| WO | WO 03/010825 | 2/2003 | |

OTHER PUBLICATIONS

Office Action issued by the Chinese Patent Office in Chinese Patent Application No. 2006101485503 on May 22, 2009.

Japanese Office Action dated Oct. 20, 2009, in corresponding Japanese Patent Application No. 2006-254730.

* cited by examiner

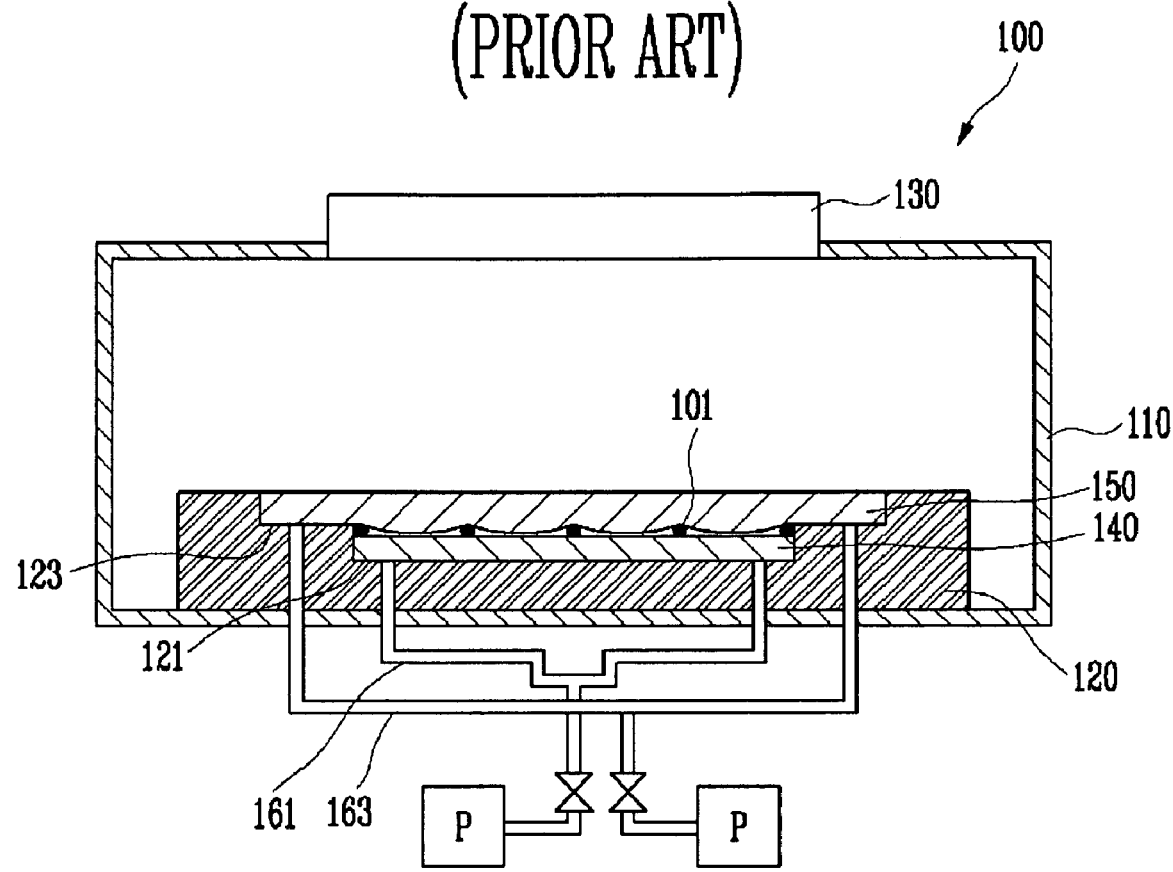

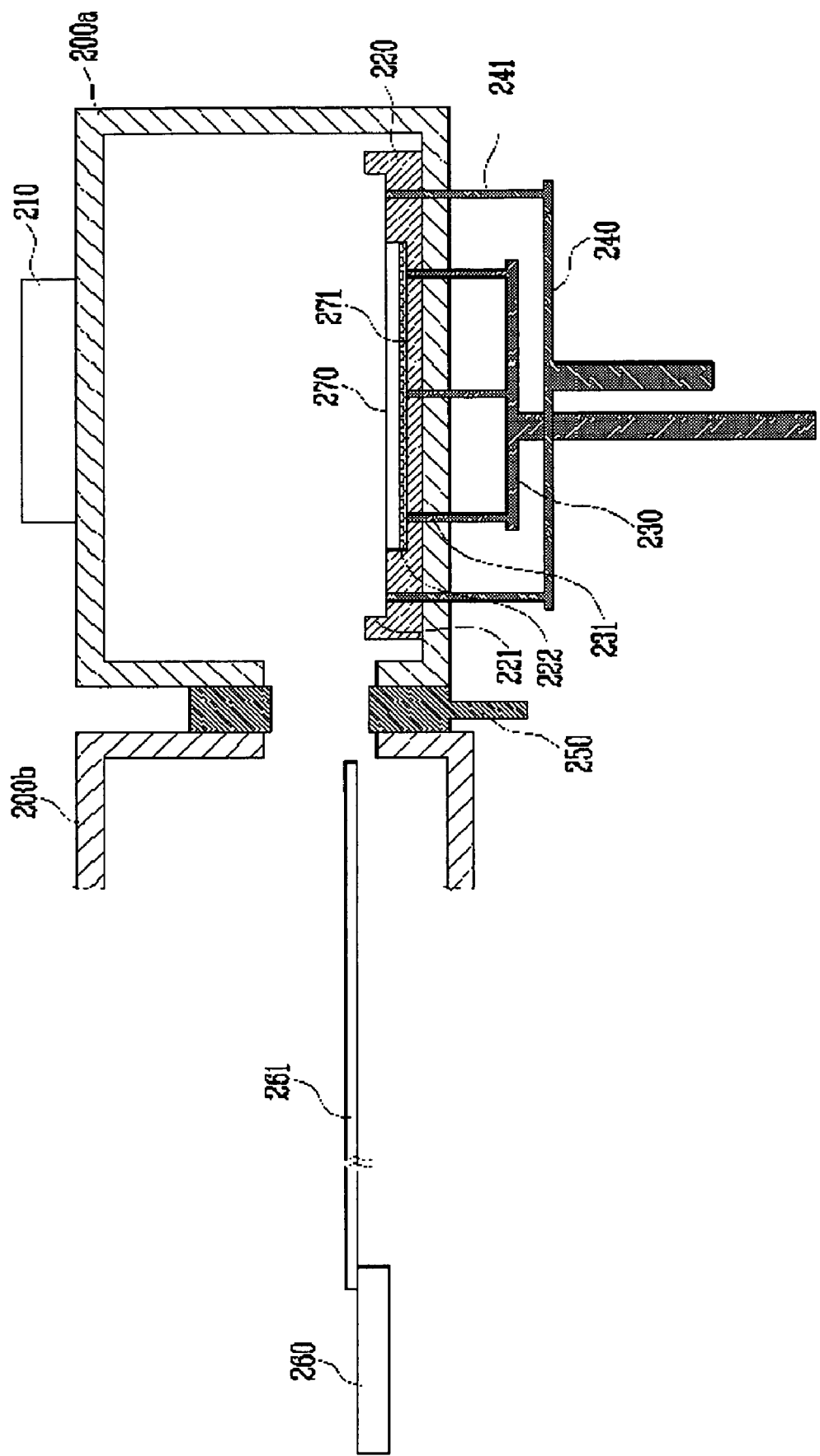

LASER INDUCED THERMAL IMAGING METHOD AND FABRICATING METHOD OF ORGANIC LIGHT-EMITTING DIODE USING THE SAME

CROSS-REFERENCE TO RELATED APPLICATIONS

This application claims the benefit of Korean Application No. 2005-109824, filed Nov. 16, 2005, in the Korean Intellectual Property Office, the entire content of which is incorporated herein by reference.

BACKGROUND OF THE INVENTION

1. Field of the Invention

Aspects of the present invention relate to a laser induced thermal imaging method and a fabricating method of an organic light-emitting diode using the same, and more specifically to a laser induced thermal imaging method capable of laminating a donor film and an acceptor substrate using a magnetic force when the organic film layer is laminated on the acceptor substrate using the laser induced thermal imaging method; and a fabricating method of an organic light-emitting diode using the same.

2. Description of the Related Art

Aspects of the present invention relate to a laser induced thermal imaging device and a laser induced thermal imaging method, and a fabricating method of an organic light-emitting diode using the same, and more specifically to a laser induced thermal imaging device and a laser induced thermal imaging method capable of improving an adhesive property between an acceptor substrate and an imaging layer of a donor film using a magnetic force by including a first magnet in the acceptor substrate and a second magnet in the donor film when an organic film layer is laminated on the acceptor substrate using the laser induced thermal imaging method; and a fabricating method of an organic light-emitting diode using the same.

Among methods of forming an organic film layer of an organic light-emitting diode, a deposition method, in which an organic film layer is formed by vacuum-depositing an organic light-emitting material with a shadow mask, has disadvantages that it is difficult to form a superfine micropattern due to a deformed mask, etc. and it is also difficult to be applied to a large-area display.

In order to solve the problems of the deposition method, there has been proposed an ink jet method for directly patterning an organic film layer. The ink jet process is a method for forming an organic film layer by discharging a discharge solution from a head of an ink jet printer, the discharge solution obtained by dissolving or dispersing a light-emitting material in a solvent. The ink jet process is relatively simple in processing, but has disadvantages that it has a reduced yield, a non-uniform film thickness, and it is difficult to be applied to a large-area display.

Meanwhile, there has been proposed a method of forming an organic film layer using a laser induced thermal imaging technique. The laser induced thermal imaging method is a method in which an imaging layer is closely adhered to an acceptor substrate and then transferred by scanning a laser to a donor film which includes a base substrate, a light-heat converting layer and the imaging layer, converting the laser passed through the base substrate into heat in the light-heat converting layer to extend the light-heat converting layer, and extend the adjacent imaging layers. The laser induced thermal imaging method is a process having inherent advantages such as high-resolution pattern formation, uniformity of film thickness, an ability to laminate a multilayer, and extendability into a large-sized motherglass.

When the conventional laser induced thermal imaging method is carried out, the method is preferably carried out under a vacuum state so that the inside of a chamber in which the light-emitting layer is transferred can be aligned with other deposition processes upon forming a light-emitting device, and therefore the method is generally carried out under a vacuum state, but when the laser thermal transfer is carried out under a vacuum state according to the conventional method, then it has a disadvantage that a transfer property of the imaging layer is deteriorated since a conventionally applied coupling force is reduced between the donor film and the acceptor substrate. Accordingly, a method of laminating a donor film and an acceptor substrate is very important in the case of the laser induced thermal imaging method, and therefore there have been attempts to solve such problems.

Hereinafter, a laser induced thermal imaging method and a thermal transfer imaging device according to the conventional art will be described in detail referring to the accompanying drawings.

FIG. 1 is a partial cross-sectional view showing a thermal transfer imaging device according to the conventional art.

Referring to FIG. 1, the thermal transfer imaging device 100 includes a substrate stage 120 arranged inside of a chamber 110 and a laser irradiation apparatus 130 arranged on an upper portion of the chamber 110.

On the substrate stage 120 an acceptor substrate 140 introduced into the chamber 110, and a donor film 150 are sequentially arranged, in a first anchoring groove 121 and a second anchoring groove 123 for arranging an acceptor substrate 140 and a donor film 150, respectively, in the substrate stage 120. The first anchoring groove 121 is formed along a peripheral direction of the acceptor substrate 140, and the second anchoring groove 123 is formed along a peripheral direction of the donor film 150. Generally, the acceptor substrate 140 has a smaller area than that of the donor film 150, and therefore the first anchoring groove 121 is formed at a smaller size than that of the second anchoring groove 123.

At this time, in order to carry out the lamination without a foreign substance or a space between the acceptor substrate 140 and the donor film 150, the inside of the chamber 110 in which the laser thermal transfer is generated is at ambient pressure, and pipes 161,163 are each connected to lower portions of the first anchoring groove 121 and the second anchoring groove 123, respectively, and sucked into a vacuum pump P to couple the acceptor substrate 140 and the donor film 150 to each other.

However, while other methods for manufacturing an organic light-emitting diode are maintained under a vacuum state, a method of adhering the acceptor substrate and the donor film by means of the vacuum pump is not used under a vacuum state inside of the chamber, and therefore the method has a disadvantage that the life span and the reliability of the product are adversely affected.

SUMMARY OF THE INVENTION

Aspects of the present invention are designed to solve such drawbacks and/or other problems of the conventional art, and therefore an aspect of the present invention is to provide a laser induced thermal imaging method capable of laminating a donor film and an acceptor substrate using a magnetic force, wherein a laser thermal transfer is carried out under a vacuum state, such that a foreign substance does not become lodged nor a space generated between the donor film and the acceptor substrate; and a fabricating method of an organic light-emitting diode using the same.

The foregoing and/or other aspects of the present invention are achieved by providing a laser induced thermal imaging method including arranging an acceptor substrate, in which a first magnet is formed in one surface thereof, on a substrate stage in a processing chamber; arranging on the acceptor substrate a donor film including a second magnet; laminating the donor film and the acceptor substrate using a magnetic force acting between the first and second magnets; and transferring at least one region of an imaging layer onto the acceptor substrate by scanning a laser on the donor film.

While not required in all aspects, preferably, the donor film includes a base substrate; a light-heat converting layer formed on the base substrate; an imaging layer formed on the light-heat converting layer; and a magnet formed on at least one surface of the light-heat converting layer. Also, the laser induced thermal imaging method further includes an interlayer insulating between the light-heat converting layer and the imaging layer. The magnet is an electromagnet or a permanent magnet, and formed in at least one shape of a rod or a cylinder. The electromagnet or the permanent magnet is concentrically arranged, but arranged parallel to a plurality of longitudinal directions and a plurality of transversal directions. While not required in all aspects, the permanent magnet is made of permanent magnet nanoparticles, and the permanent magnet nanoparticles are formed using spin coating, E-beam deposition, or an ink jet method, and an electric cable for applying a voltage is included in the electromagnet. The processing chamber is also a vacuum chamber.

The foregoing and/or other aspects of the present invention are achieved by providing a method of fabricating an organic light-emitting diode formed between a first electrode and a second electrode using a laser induced thermal imaging method according to aspects of the present invention, including an acceptor substrate-transmission operation of arranging on a substrate stage an acceptor substrate having a pixel region and including a first magnet; a donor film-transmission operation of transmitting on the acceptor substrate a donor film including a second magnet and having a light-emitting layer; a lamination operation of coupling the acceptor substrate and the donor film to each other using a magnetic force between the first magnet formed in the acceptor substrate and the second magnet included in the donor film; and a transfer operation of transferring the light-emitting layer to the pixel region of the acceptor substrate by scanning a laser to the donor film.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 1 is a partial cross-sectional view showing a thermal transfer imaging device according to the conventional art.

FIGS. 2A to 2H are cross-sectional views according to operations of a process for describing a laser induced thermal imaging method according to an aspect of the present invention.

DETAILED DESCRIPTION OF THE EMBODIMENTS

Figure 2A:
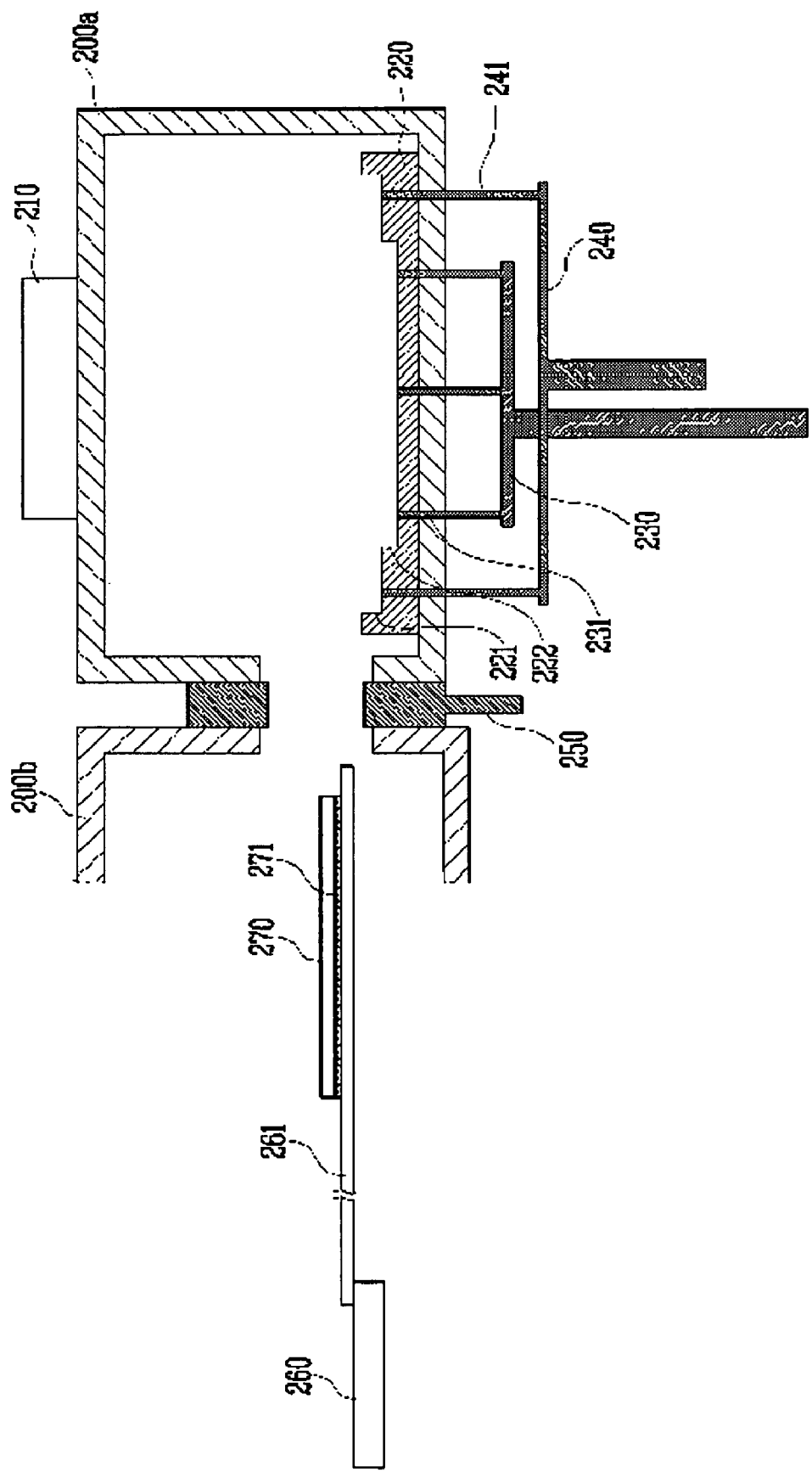

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Referring to FIGS. 2A to 2H, one embodiment of the laser induced thermal imaging method according to aspects of the present invention will be described herein. The thermal transfer imaging device for carrying out the laser induced thermal imaging method according to an aspect of the present invention includes a processing chamber 200a, a transmission chamber 200b, a substrate stage 220 and a laser oscillator 210.

A processing chamber such as used in the conventional thermal transfer imaging devices may be used as the processing chamber 200a, and outside of the processing chamber 200a is provided a transmission chamber 200b including a robot arm 260 and an end-effector 261, etc., for transmitting a donor film 280 or an acceptor substrate 270 into the processing chamber 200a, wherein the donor film 280 includes a first magnet (not shown) and the acceptor substrate 270 includes a second magnet 271. A gate valve 250 is located between the processing chamber 200a and the transmission chamber 200b. The gate valve 250 functions to insulate the transmission chamber 200b from the processing chamber 200a.

Meanwhile, the substrate stage 220 further includes a driving unit (not shown) for movement. For example, the substrate stage 220 may further include a driving unit to translate the substrate stage 220 in a horizontal direction when a laser is scanned in a vertical direction.

Also, the substrate stage 220 may include installation units to receive and install the acceptor substrate 270 and the donor film 280. The installation unit is able to install an acceptor substrate 270 in a certain position on the substrate stage 220, wherein the acceptor substrate 270 is transmitted into the processing chamber 200a by means of the transmission unit such as the robot arm 260 and the end-effector 261 present in the transmission chamber 200b.

According to an aspect of this embodiment, the installation unit may include a through hole (not shown), guide bars 231, 241, moving plates 230, 240, a support (not shown) and anchoring grooves 221, 222. At this time, the guide bars 231, 241 move up or down along with the moving plates 230, 240 and the supports, that is, the guide bars 231, 241 receive the acceptor substrate 270 while moving up through the through holes, and then anchor the acceptor substrate 270 in anchoring grooves 221, 222 while moving down. At this time, the anchoring grooves 221, 222 are preferably formed aslant to a wall surface to anchor the acceptor substrate 270 and the donor film 280 in an exact position.

Although the description of the embodiments of the present invention refers to positions of some elements oriented in a vertical arrangement, it is understood that the present invention is not limited thereto, that is, such elements can be oriented horizontally. For example, the guide bars 231, 241 can be located on one side of the processing chamber 200a and move left or right along with the moving plates 230, 240 and the support, that is, the guide bars 231, 241 receive the acceptor substrate 270 while moving left through the through hole, and then anchor the acceptor substrate 270 in anchoring grooves 221, 222 while moving right. Similarly, although the description of the embodiments of the present invention refers to positions of some elements oriented in a horizontal arrangement, it is understood that the present invention is not limited thereto, that is, such elements can be oriented vertically.

The through holes are holes formed in the substrate stage 220 so that guide bars 231, 241 for supporting the donor film 280 and the acceptor substrate 270 can move up and down. The supports function to move up and down while supporting the guide bars 231, 241 and the moving plates 230, 240, and are connected with a separate motor (not shown).

The laser oscillator 210 may be installed either inside or outside of the processing chamber 200a, and preferably installed so that a laser can scan toward the substrate stage.

In an embodiment of the present invention applied to manufacturing the organic light-emitting diode, the laser induced thermal imaging method includes a transmission operation of an acceptor substrate 270, a transmission operation of a donor film 280, a lamination step and a transfer operation.

Figure 2B:
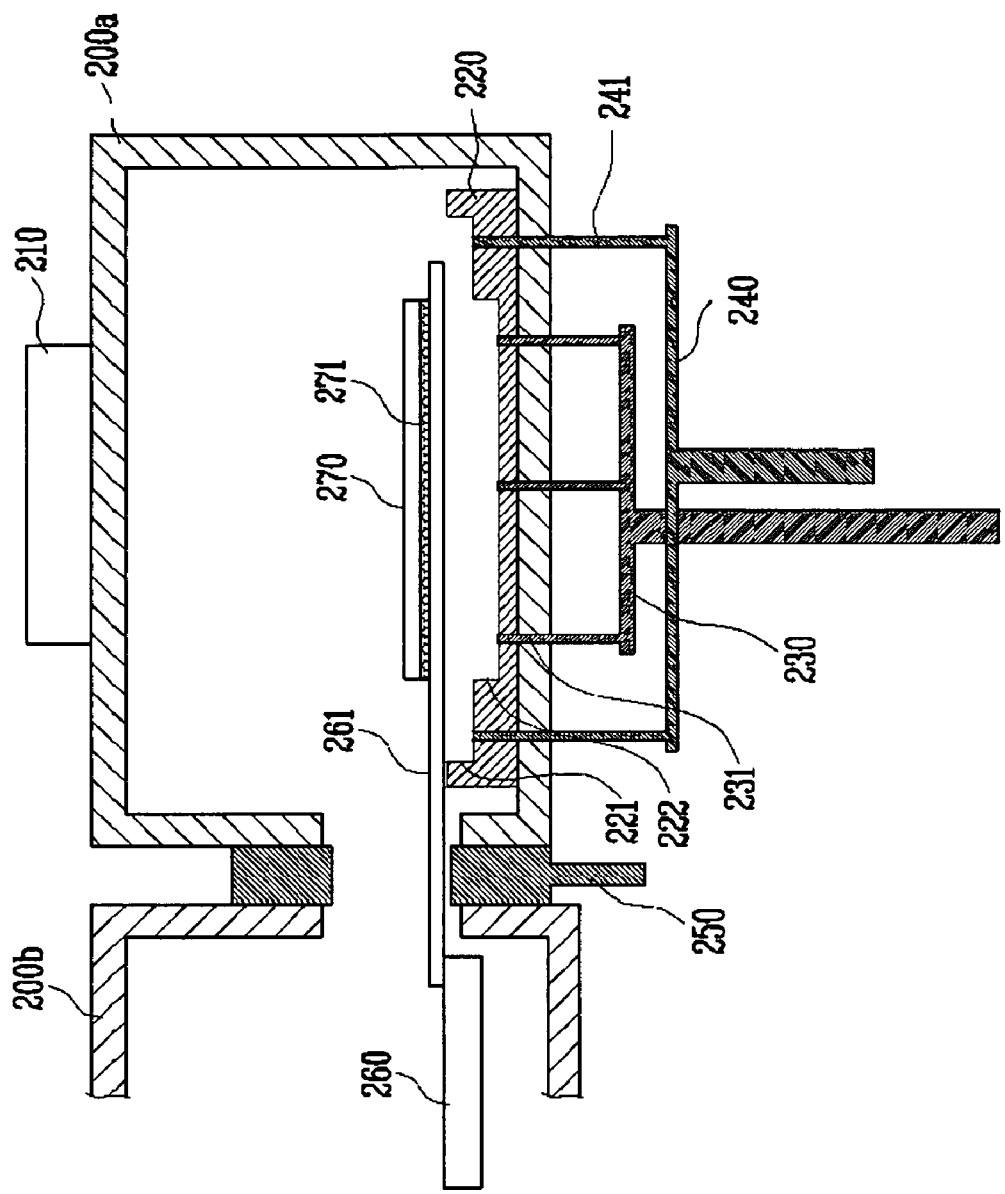
Figure 2C:
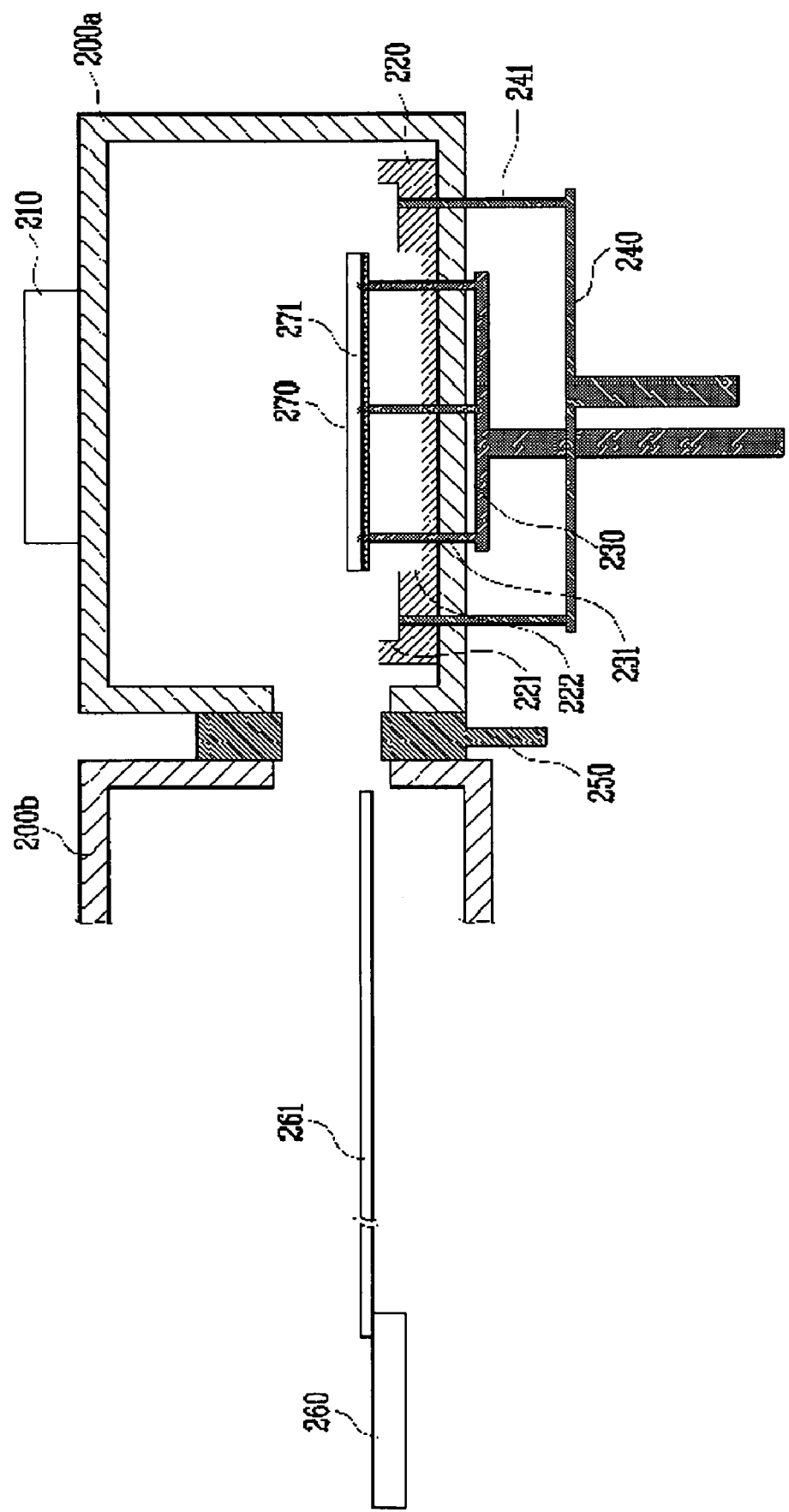

The transmission operation of the acceptor substrate 270 is an operation of arranging the acceptor substrate 270 into a processing chamber 200a of a thermal transfer imaging device, wherein the acceptor substrate 270 including a first magnet 271 is arranged on an end-effector 261 which is a transmission unit of the transmission chamber 200a (FIG. 2A). The end-effector 261 is introduced into the processing chamber 200a by means of a robot arm 260 to arrange the acceptor substrate 270 on an upper portion of the substrate stage 220 (FIG. 2B). The acceptor substrate 270 transmitted into the processing chamber 200a is supported by a first guide bar 231 moving up through a first through hole. Then, the end-effector 261 slips out of the processing chamber 200a and returns to the transmission chamber 200b (FIG. 2C). The first guide bar 231 supporting the acceptor substrate 270 exactly arranges the acceptor substrate 270 on a first anchoring groove 222 of the substrate stage 220 while moving down (FIG. 2D).

Figure 2E:
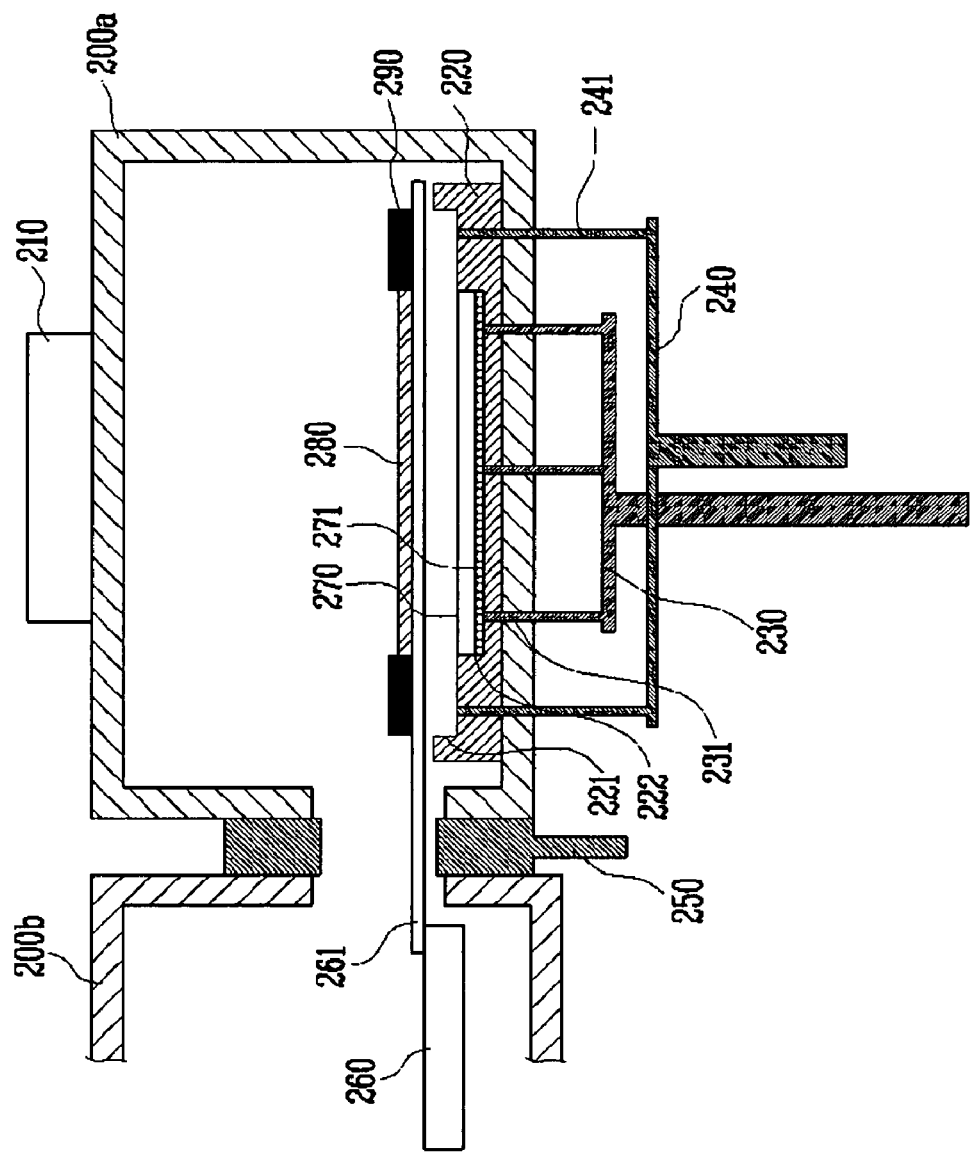
Figure 2F:
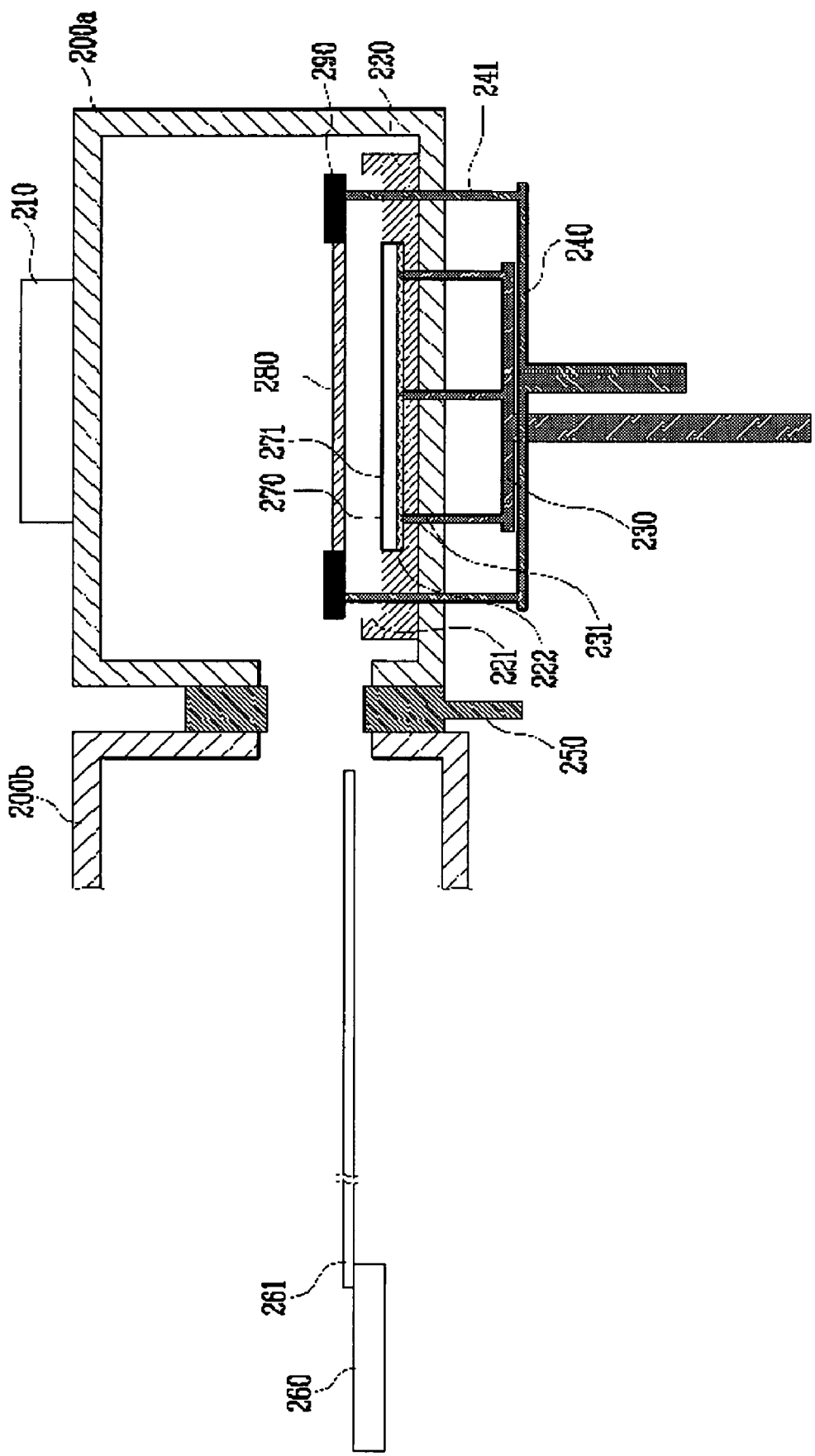
Figure 2G:
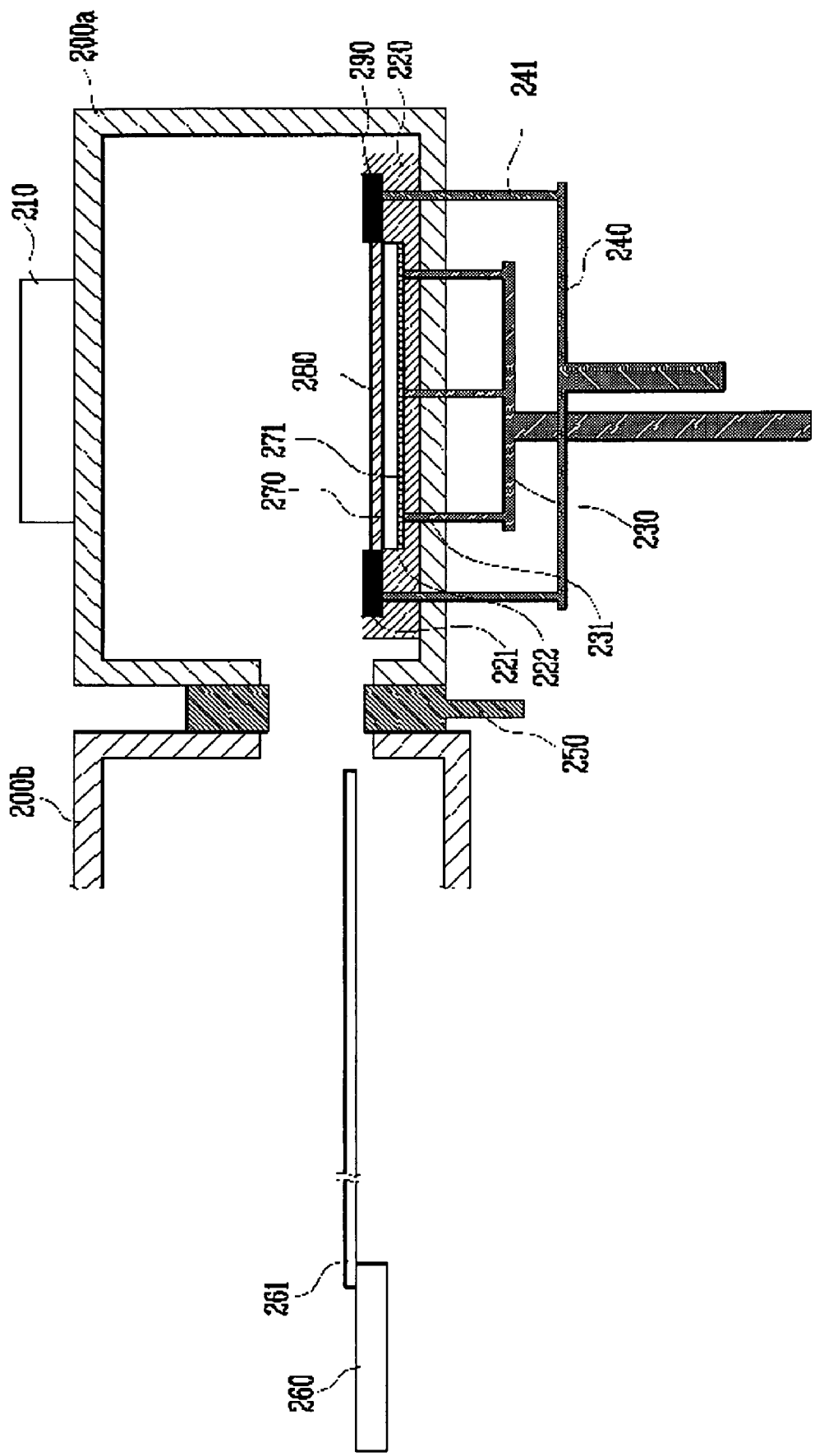

The transmission operation of the donor film 280 is similar to the transmission operation of the acceptor substrate 270, wherein the donor film 280 is transmitted into the processing chamber 200a by the transmission unit such as the end-effector 261, etc., connected to the robot arm 260 arranged in the transmission chamber 200b (FIG. 2E). At this time, the donor film 280 is preferably transmitted by a film tray 290. The donor film 280 transmitted into the processing chamber 200a is supported by a second guide bar 241 moving up through a second through hole. When the donor film 280 is supported by the second guide bar 241, the robot arm 260 slips the end-effector 261 out of the processing chamber 200a and returns the end-effector 261 to the transmission chamber 200b (FIG. 2F). The second guide bar 241 supporting the donor film 280 arranges the donor film 280 precisely on a second anchoring groove 221 of the substrate stage 220 while moving down again (FIG. 2G).

The lamination operation is an operation of coupling the acceptor substrate 270 and the donor film 280 to each other using a magnetic force generated between the acceptor substrate 270 and the donor film by applying a power source to an electric cable included in the first magnet 271 formed in the acceptor substrate 270, and having a second magnet (not shown) in the donor film 280. At this time, the inside of the processing chamber 200a is maintained under a vacuum state, and therefore a foreign substance or a space is minimally generated between the donor film 280 and the acceptor substrate 270, resulting in an improved transfer efficiency.

Figure 2H:
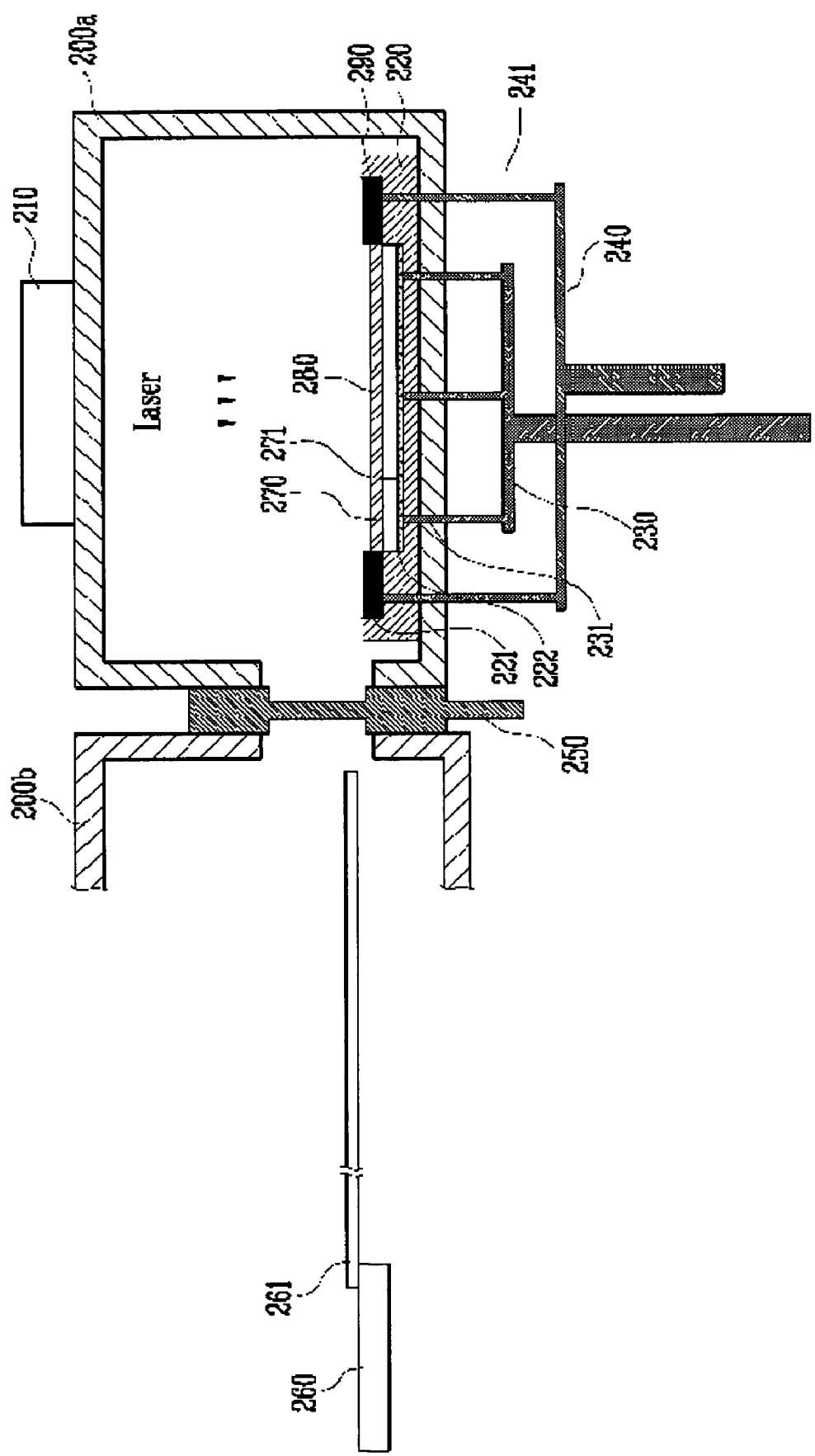

The transfer operation is an operation of transferring a light-emitting layer formed in the donor film 280 to one region of a pixel barrier of the acceptor substrate 270 and an opening in the pixel barrier by scanning a laser on the donor film 280 laminated to the acceptor substrate 270 using a laser irradiation apparatus 210. When the laser is scanned, a light-heat converting layer of the donor film 280 is expanded, and therefore the adjacent light-emitting layers are also expanded in a direction of the acceptor substrate 270, and the transfer is finally carried out by contacting the light-emitting layer to the acceptor substrate 270 (FIG. 2H).

Hereinafter, the laser thermal transfer donor film according to an embodiment of the present invention including a magnet will be described. The donor film is a film provided with an imaging layer to be transferred to an acceptor substrate, and includes a base substrate, a light-heat converting layer and an imaging layer, each sequentially laminated. At this time, a buffer layer and an interlayer may be further provided between the light-heat converting layer and the imaging layer so as to improve the performance of the laser induced thermal imaging transfer process.

The laser thermal transfer donor film according to this embodiment of the present invention includes a magnet. In this case, at least one magnet is formed between many layers of the donor film.

Figure 3:
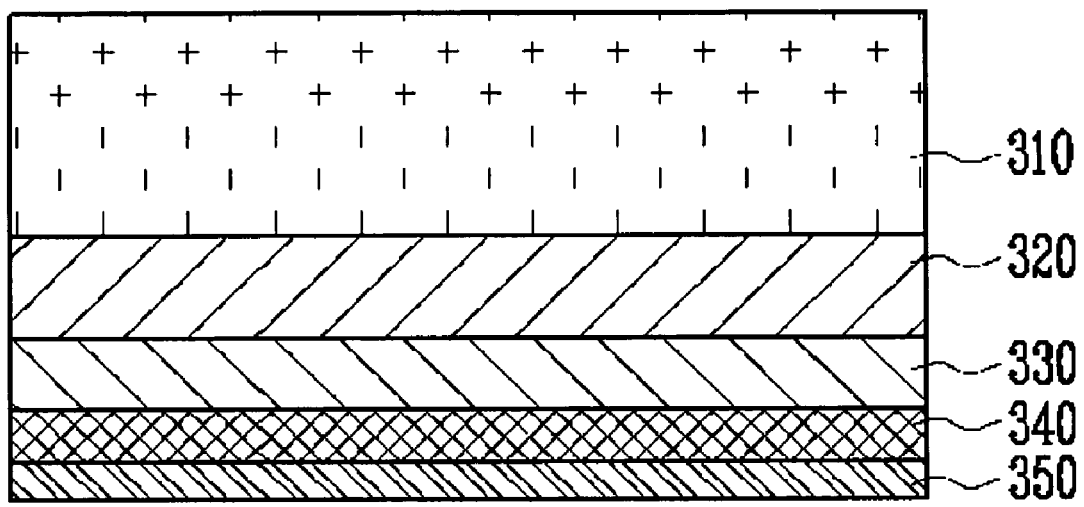
FIG. 3 is a cross-sectional view showing a first embodiment of a donor film for laser transfer according to an aspect of the present invention.

FIG. 3 is a cross-sectional view showing a first embodiment of a donor film for laser transfer according to the present invention. Referring to FIG. 3, the donor film is composed of a base substrate 310, a light-heat converting layer 320, a magnet 330, an interlayer 340 and an imaging layer 350.

The base substrate 310 is a substrate functioning as a support of the donor film, wherein the substrate is preferably made of a transparent polymer, and has a thickness of 10 to 500 μm. While not required in all aspects, polyester, polyacryl, polyepoxy, polyethylene, polystyrene, etc., may be used as the transparent polymer, but the base substrate 310 is not limited thereto.

The light-heat converting layer 320 is a layer composed of light absorbing materials that absorb laser light to convert into heat, wherein a thickness of the light-heat converting layer 320 is varied depending on the light absorbing materials used and the manufacturing methods, but a layer composed of metal or metal oxides is preferably formed at a thickness of 100 to 5000 Å using a vacuum deposition method, a laser beam deposition method, or sputtering, and a layer formed of an organic film is preferably formed at a thickness of 0.1 to 2 μm using an extrusion coating method, a gravure coating method, a spin coating method or a knife coating method.

If the light-heat converting layer 320 is formed at a thickness less than the range mentioned above, then an energy level is generally too low due to a low energy absorption rate, and therefore only a small amount of the energy is converted into heat and an expansion pressure is reduced, while if the thickness of the light-heat converting layer 320 exceeds the mentioned range, then generally, a poor edge opening may be generated due to a height difference generated between the donor film and the acceptor substrate.

A light absorbing material composed of metal or metal oxides, etc. has an optical density of 0.1 to 0.4, and includes such metals and oxides as aluminum, silver, chromium, tungsten, tin, nickel, titanium, cobalt, zinc, gold, copper, tungsten, molybdenum, lead and oxides thereof.

Also, a photosynthetic material composed of an organic film includes a polymer into which carbon black, graphite or infrared dye is added. At this time, a material forming a polymeric binding resin includes, for example, a (metha) acrylate oligomer such as an acryl (metha)acrylate oligomer, an ester (metha)acrylate oligomer, an epoxy (metha)acrylate oligomer, an urethane (metha)acrylate oligomer, etc., or mixtures of the oligomer and a (metha)acrylate monomer, but not limited thereto.

While not required in all aspects, the magnet 330 inserted into the donor film is a layer inserted to generate a magnetic force along with another magnet inserted into an acceptor substrate as described later.

Although not shown in the drawings, the buffer layer is a layer introduced between the magnet 330 and the imaging layer 350 in order to improve a transfer property of the imaging layer 350 and enhance a life span of the device after transferring. While not required in all aspects, metal oxides, metal sulfides, non-metal inorganic compounds, or high or low molecular organic materials may be used in the buffer layer.

The interlayer 340 functions to protect the light-heat converting layer 320, and preferably has a high heat resistance, and also is composed of organic or inorganic films.

The imaging layer 350 is a layer separated from the donor film when transferred onto the acceptor substrate. When the imaging layer 350 is used for manufacturing an organic light-emitting diode, it may be composed of high or low molecular weight organic light-emitting materials so as to form a light-emitting layer. Also, the imaging layer 350 may be composed of suitable materials so as to form an electron transport layer (ETL), an electron injection layer (EIL), a hole transport layer (HTL), and a hole injection layer (HIL), respectively. At this time, materials of each of the imaging layers are not limited herein, and it is possible to use any materials which may be easily acquired and molded using methods such as an extrusion coating method, a gravure coating method, a spin coating method, a knife coating method, a vacuum deposition method, a chemical vapor deposition (CVD) method, a physical vapor deposition (PVD) method, etc.

As described above, when the magnet 330 is inserted into the donor film, the donor film is magnetized, and therefore when it is arranged in an upper portion of the acceptor substrate which has the other magnet, a magnetic attraction is established. Accordingly, the donor film and the acceptor substrate are closely adhered to each other by the magnetic force.

Figure 4:
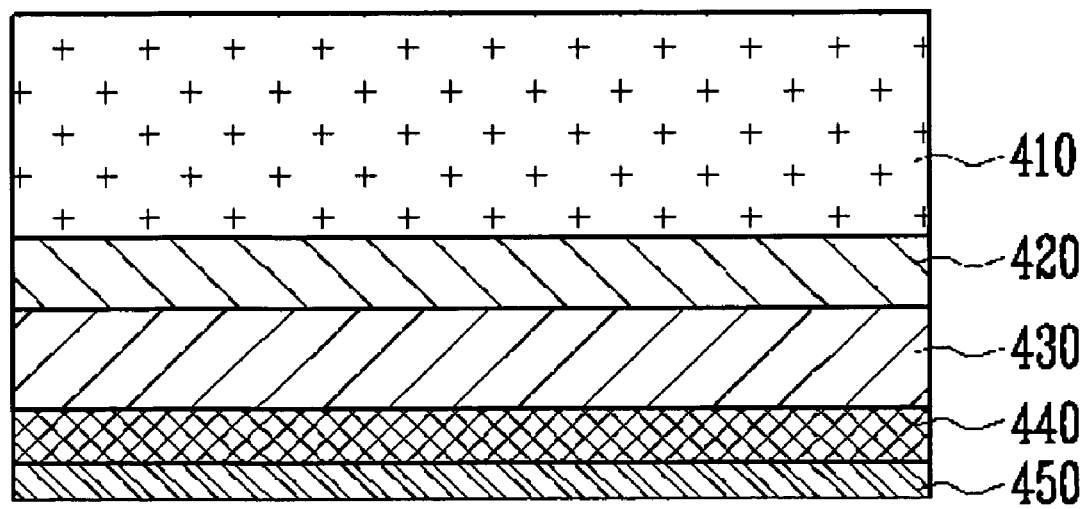
FIG. 4 is a cross-sectional view showing a second embodiment of a donor film for laser transfer according to an aspect of the present invention.

FIG. 4 is a cross-sectional view showing a second embodiment of a donor film for laser transfer according to aspects of the present invention. Referring to FIG. 4, contrary to FIG. 3 in which the magnet 330 is formed between the light-heat converting layer 320 and the interlayer 340, a magnet 420 is formed between a base substrate 410 and a light-heat converting layer 430. The donor film according to the present embodiment includes an interlayer 440 and an imaging layer 450. Each of the layers has the same function as in FIG. 3, and therefore their detailed descriptions are omitted here.

Figure 5:
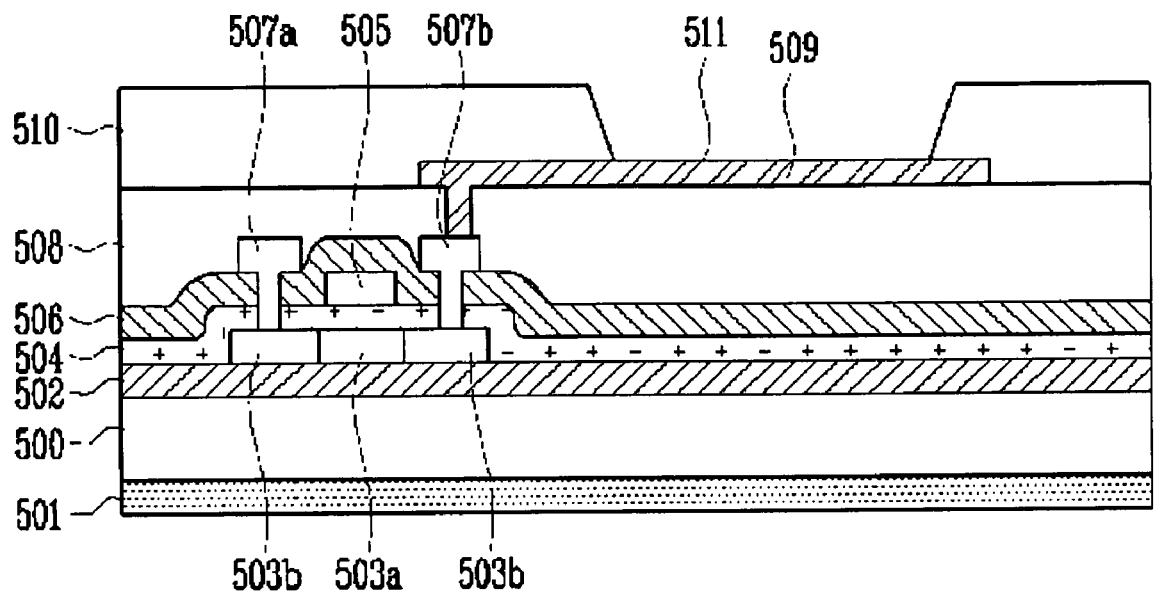
FIG. 5 is a cross-sectional view showing a first embodiment of an acceptor substrate according to an aspect of the present invention.

FIG. 5 is a cross-sectional view showing a first embodiment of an acceptor substrate according to aspects of the present invention. Referring to FIG. 5, a structure on the acceptor substrate is described briefly. A buffer layer 502 is formed on a surface of a substrate 500, and a magnet 501 is formed on the other surface of the substrate 500 opposite to the surface on which the buffer layer 502 is formed.

The magnet 501 formed on the substrate 500 is an electromagnet or a permanent magnet, and formed in at least one shape of a rod or a cylinder. The electromagnet or the permanent magnet is concentrically arranged, or arranged parallel to a plurality of longitudinal directions and a plurality of transversal directions. While not required in all aspects, the permanent magnet is made of permanent magnet nanoparticles, and the permanent magnet nanoparticles are formed using a spin coating, E-Beam deposition or an ink jet method, and an electric cable for applying voltage is included in the electromagnet.

On one region of the buffer layer 502 is formed a semiconductor layer including a low doped drain (LDD) layer (not shown) between an active channel layer 503a and ohmic contact layers 503b. A gate insulating film 504 and a gate electrode 505 are sequentially patterned on the semiconductor layer. An interlayer 506 and source and drain electrodes 507a, 507b are formed on one region of the interlayer 506, wherein the interlayer 506 is formed on the gate electrode 505, and formed so that the ohmic contact layers 503b of the semiconductor layer can be exposed, and the source and drain electrodes 507a, 507b are connected to the exposed ohmic contact layers 503b.

An over coat 508 is formed on the interlayer 506. The drain electrode 507b and a first electrode layer 509 are electrically connected to each other through a via hole (not shown) formed in the over coat 508 such that the drain electrode 507b can be exposed by etching one region of the over coat 508. The first electrode layer 509 is formed on one region of the over coat 508, and on the over coat 508 is formed a pixel barrier 510 in which an opening 511 is formed for exposing the first electrode layer 509 at least partially.

FIGS. 6 and 7A-7E are cross-sectional views showing other embodiments of an acceptor substrate according to aspects of the present invention, and therefore a description of the same configuration as in FIG. 5 is omitted here.

Figure 6:
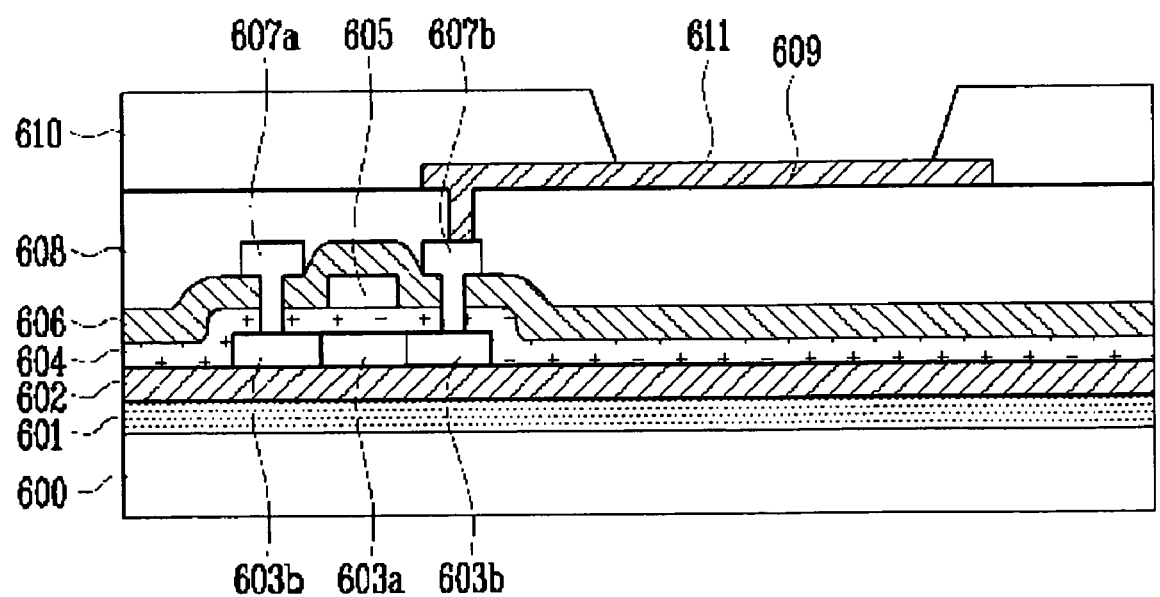
FIG. 6 is a cross-sectional view showing a second embodiment of an acceptor substrate according to an aspect of the present invention.

FIG. 6 is a cross-sectional view showing a second embodiment of an acceptor substrate according to aspects of the present invention. In FIG. 6, an electromagnet or a permanent magnet is formed between a substrate 600 and a buffer layer 602, and formed in at least one shape of a rod or a cylinder. The electromagnet or the permanent magnet is also concentrically arranged, but arranged parallel to a plurality of longitudinal directions and a plurality of transversal directions. While not required in all aspects, the permanent magnet is made of permanent magnet nanoparticles, and the permanent magnet nanoparticles are formed using spin coating, E-beam deposition, or an ink jet method, and an electric cable for applying a voltage is included in the electromagnet. A semiconductor layer, including an active channel layer 603a and ohmic contact layers 603b, is formed on the buffer layer 602. A gate insulating film 604 and a gate electrode 605 are seguentially patterned on the semiconductor layer. An interlayer 606 and source and drain electrodes 607a, 607b are formed on the interlayer 606. all of which are covered by an overcoat 608. On the overcoat 608 is formed a pixel barrier 610 having an opening 611 to expose a first electrode layer 609.

FIGS. 7A to 7E are cross-sectional views for describing a method for fabricating an organic light-emitting diode according to an embodiment of the present invention.

Figure 7A:
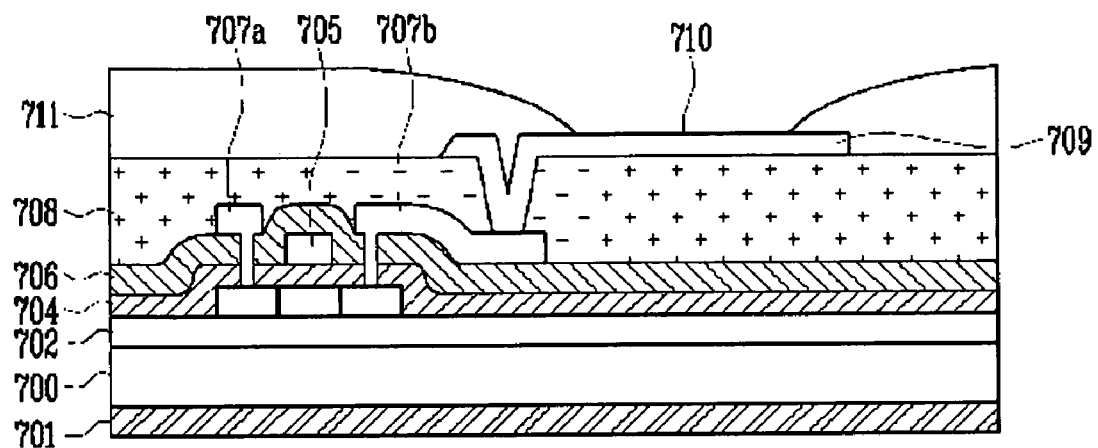
FIGS. 7A to 7E are cross-sectional views for describing a method of fabricating an organic light-emitting diode according to another aspect of the present invention.
Figure 7B:
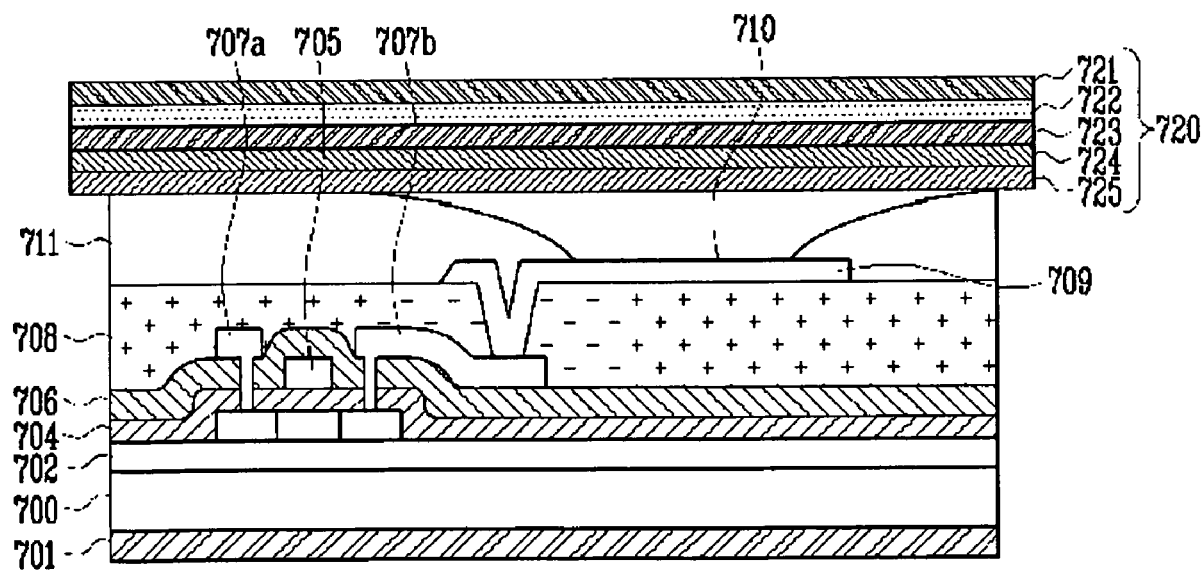

As shown in FIG. 7A, when a light-emitting layer is formed using the laser induced thermal imaging method according to an aspect of the present invention, an acceptor substrate including a magnet 701 is prepared first. As described above, the acceptor substrate has a buffer layer 702 formed on a surface of a substrate 700, a magnet 701 on another surface of the substrate 700 opposite to the surface upon which the thin film transistor is situated, and a thin film transistor formed on the buffer layer 702. The magnet 701 may be composed of nanoparticles when it is a permanent magnet, and the nanoparticles are formed using spin coating, E-beam deposition, or an ink jet method. A gate insulating film 704 and a gate electrode 705 are seguentially patterned on the thin film transistor. An interlayer 706 and source and drain electrodes 707a, 707b are formed on the interlayer 706, all of which are covered by an overcoat 708. On the overcoat 708 is formed a pixel barrier 711 having an opening 710 to which at least one region of a first electrode layer 709 is exposed.

Then, a donor film 720 is laminated on the acceptor substrate, as described above and shown in FIG. 7B. That is, a close adhesive property is enhanced by a magnetic force acting between a magnet 722 of the donor film 720 and the magnet 701 of the acceptor substrate. Since the close adhesive property between the donor film 720 and the substrate is significantly enhanced, a transfer efficiency is remarkably improved in the subsequent transfer process. The donor film 720 according to one embodiment of the present invention may include a base substrate 721, a magnet 722, a light-heat converting layer 723, an interlayer 724 and an imaging layer 725 such as a light-emitting layer, but another structure capable of including a magnet may be, of course, applied hereto.

Figure 7C:
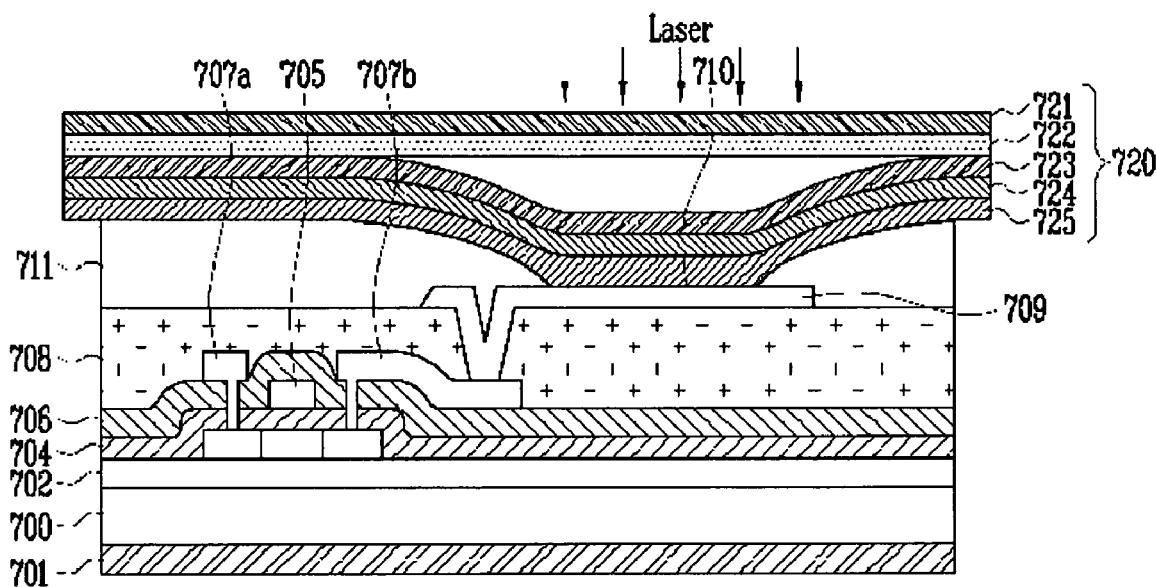

Next, a laser is locally scanned to a region to which an imaging layer such as a light-emitting layer 725 to be transferred is located on the donor film 720 while the acceptor substrate and the donor film 720 remain laminated, as shown in FIG. 7C. Where the laser is scanned, the imaging layer 725 is extended as the light-heat converting layer 723 is expanded in a direction of the acceptor substrate, and a region of the imaging layer 725 where scanned by the laser is separated from the donor film 720, and simultaneously transferred onto the acceptor substrate.

Figure 7D:
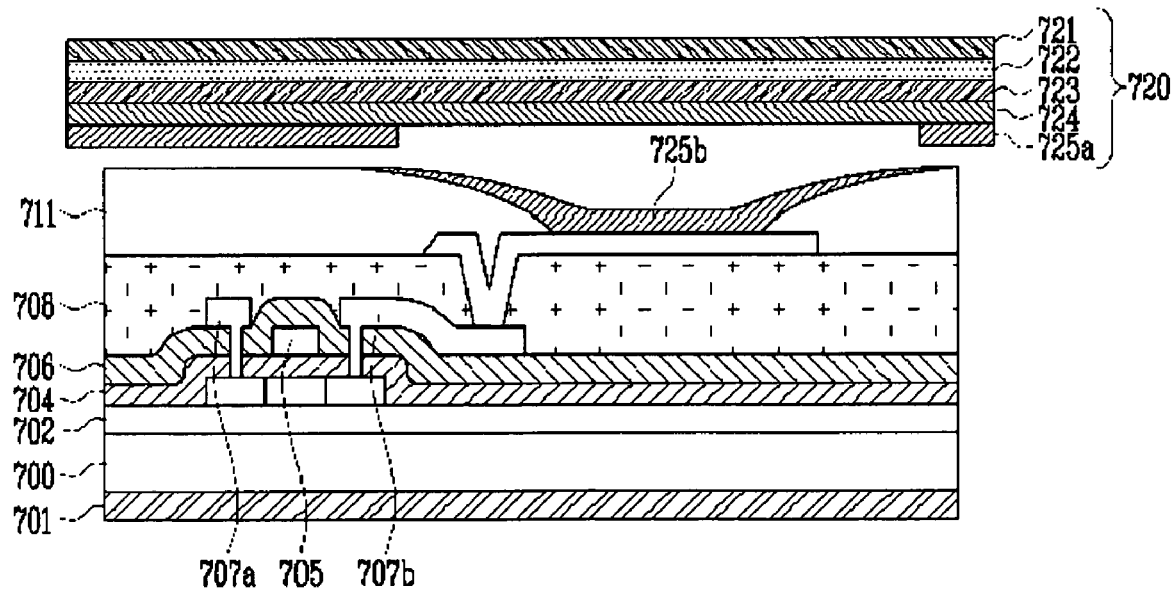

When the imaging layer 725b is transferred onto the acceptor substrate, the acceptor substrate is separated from the donor film 720, as shown in FIG. 7D. The imaging layer 725b is formed in at least one region of the pixel barrier 711 and an opening of the pixel barrier 710 on the separated acceptor substrate, and only the region of the imaging layer 725b scanned by the laser is transferred and a remaining region 725a not scanned by the laser remains intact on the donor film 720.

Figure 7E:
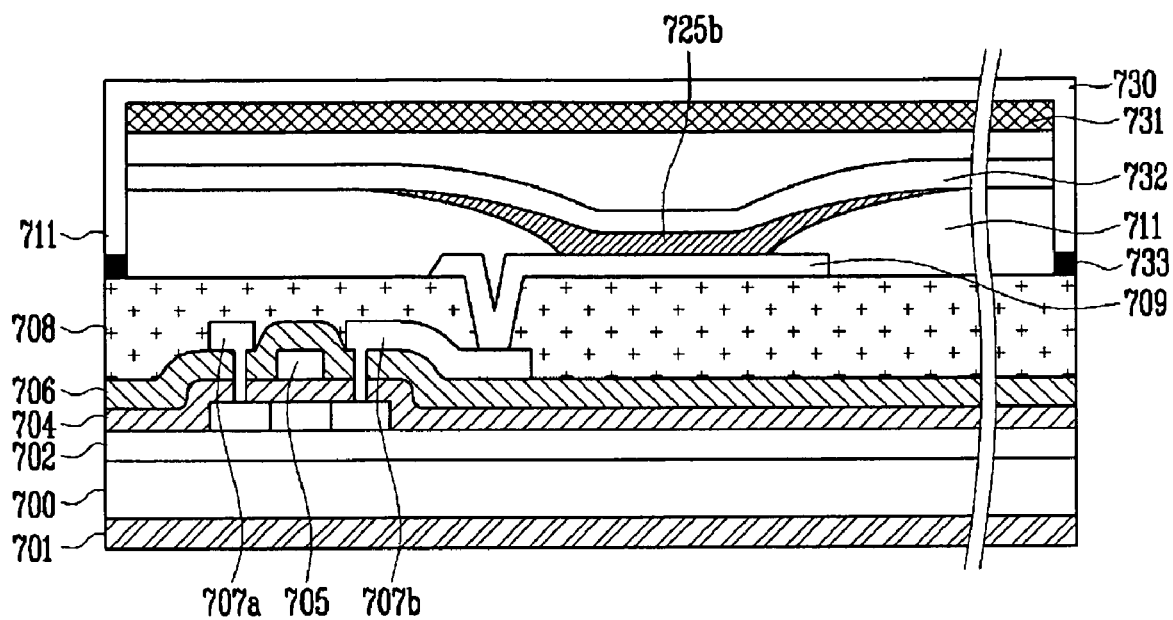

Once the imaging layer 725b is transferred onto the acceptor substrate, a second electrode layer 732 is formed on the imaging layer/light-emitting layer 725b, and an encapsulation film 730 is formed to protect the organic light-emitting diode, as shown in FIG. 7E. An absorption member 731 is formed inside of the encapsulation film 730, and the absorption member 731 functions to absorb moisture, etc. penetrated into the organic light-emitting diode. Therefore, the light-emitting layer 725b of the organic light-emitting diode may be protected from being damaged by moisture, etc. As described above, the laser induced thermal imaging method according to aspects of the present invention has the improved close adhesive force, as well as it may improve a life span, a yield and a reliability of the organic light-emitting diode since the laser thermal transfer is carried out under a vacuum state, and a foreign substance and a space is not generated between the donor film and the acceptor substrate when the donor film and the acceptor substrate are laminated using the laser induced thermal imaging method, because the donor film and the acceptor substrate are laminated by a magnetic force generated between a magnet formed in the donor film and another magnet formed in the acceptor substrate.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A laser induced thermal imaging method comprising:
   arranging an acceptor substrate, in which a first magnet is formed in at least one surface thereof, on a substrate stage in a processing chamber;
   arranging on the acceptor substrate a donor film including a second magnet;
   laminating the donor film and the acceptor substrate using a magnetic force acting between the first and second magnets; and
   transferring at least one region of an imaging layer to the acceptor substrate by scanning a laser on the donor film.

2. The laser induced thermal imaging method according to claim 1, wherein the donor film comprises:
   a base substrate;
   a light-heat converting layer formed on the base substrate
   the imaging layer formed on the light-heat converting layer; and
   the second magnet formed on at least one surface of the light-heat converting layer.

3. The laser induced thermal imaging method according to claim 2, wherein the donor film further comprises an interlayer between the light-heat converting layer and the imaging layer.

4. The laser induced thermal imaging method according to claim 1, wherein the first and second magnets are formed in at least one shape of a rod or a cylinder.

5. The laser induced thermal imaging method according to claim 1, wherein the first and second magnets are electromagnets or permanent magnets.

6. The laser induced thermal imaging method according to claim 5, wherein the electromagnets or the permanent magnets are concentrically arranged.

7. The laser induced thermal imaging method according to claim 5, wherein the electromagnets or the permanent magnets are arranged parallel to a plurality of longitudinal directions and a plurality of transversal directions.

8. The laser induced thermal imaging method according to claim 5, wherein the permanent magnet is made of permanent magnet nanoparticles.

9. The laser induced thermal imaging method according to claim 8, wherein the permanent magnet nanoparticles are formed using spin coating, E-beam deposition, or an ink jet method.

10. The laser induced thermal imaging method according to claim 5, wherein the electromagnets further comprise electric cables to apply a voltage in the electromagnets.

11. The laser induced thermal imaging method according to claim 1, wherein the processing chamber is a vacuum chamber.

12. A method of fabricating an organic light-emitting diode formed between a first electrode and a second electrode using a laser induced thermal imaging method, comprising:

arranging on a substrate stage an acceptor substrate having a pixel region formed therein and including a first magnet;

transmitting on the acceptor substrate a donor film including a second magnet and the donor film having a light-emitting layer;

coupling the acceptor substrate and the donor film to each other using a magnetic force between the first and second magnets; and transferring the light-emitting layer to the pixel region of the acceptor substrate by scanning a laser to the donor film.

13. The method of fabricating an organic light-emitting diode according to claim 12, further comprising:

forming a second electrode layer on the light emitting layer; and forming an encapsulation film on the organic light-emitting diode to protect the organic light-emitting diode.

14. The method of fabricating an organic light-emitting diode according to claim 13, wherein transferring the encapsulation film includes having an absorption member between the second electrode layer and the encapsulation film to absorb moisture penetrated into the organic light-emitting diode.

15. A method of securing a donor film to an acceptor substrate for laser induced thermal imaging, comprising:

supporting the donor film on the acceptor substrate, wherein the acceptor substrate has a first magnet and the donor film has a second magnet; and applying a magnetic force between the first and second magnets to laminate the donor film to the acceptor substrate.

16. The method of securing a donor film to an acceptor substrate according to claim 15, further comprising:

evacuating a vacuum chamber; and supporting the donor film on the acceptor substrate and applying the laminating magnetic force between the acceptor substrate and the donor film in the vacuum chamber.

17. A laser induced thermal imaging apparatus comprising:

a donor film on an acceptor substrate, wherein the acceptor substrate has a first magnet and the donor film has a second magnet to exert a uniform laminating force between the donor film and the acceptor substrate; and a laser to irradiate at least one region of the donor film.

18. The laser induced thermal imaging apparatus according to claim 17, further comprising a vacuum chamber.

19. A method of producing an organic light-emitting diode in which a light-emitting layer is formed between a first electrode layer and a second electrode layer using laser induced thermal imaging, comprising:

supporting a donor film having a light-emitting layer on an acceptor substrate, wherein the acceptor substrate has a first magnet and the donor film has a second magnet to exert a uniform laminating force between the donor film and the acceptor substrate; and transferring the light-emitting layer to a pixel region of the acceptor substrate by irradiating a laser to the donor film.

* * * * *

UNITED STATES PATENT AND TRADEMARK OFFICE
CERTIFICATE OF CORRECTION

PATENT NO.      : 7,666,570 B2                    Page 1 of 1
APPLICATION NO. : 11/508162
DATED           : February 23, 2010
INVENTOR(S)     : Sok Won Noh et al.

It is certified that error appears in the above-identified patent and that said Letters Patent is hereby corrected as shown below:

Title Page, Item (73) Assignee, "Yongin" should be --Yongin-City--.

Column 10, line 29, insert --;-- after "substrate".

Signed and Sealed this
Fourth Day of January, 2011

David J. Kappos
*Director of the United States Patent and Trademark Office*